United States Patent [19]
Inagawa

[11] Patent Number: 5,790,383
[45] Date of Patent: Aug. 4, 1998

[54] PRINTED CIRCUIT BOARD

[75] Inventor: Hideho Inagawa, Yokohama, Japan

[73] Assignee: Canon Kabushiki Kaisha, Tokyo, Japan

[21] Appl. No.: 801,363

[22] Filed: Feb. 19, 1997

[30] Foreign Application Priority Data

Feb. 20, 1996 [JP] Japan ................................. 8-032378

[51] Int. Cl.⁶ ........................................... H05K 1/18
[52] U.S. Cl. .......................... 361/760; 361/826; 361/794; 361/765; 361/764; 257/684; 257/692; 257/695; 257/698; 439/55; 439/59; 439/65; 439/68; 174/250; 174/255; 174/262; 174/260
[58] Field of Search .................... 361/760, 761, 361/764, 765, 772, 773, 774, 777, 783, 791, 794, 799, 784, 785, 803, 826, 780, 750, 762, 807, 809, 810; 257/684, 692, 693, 695, 698, 723, 724, 730, 750, 773, 774, 776, 782, 784; 174/250, 255, 262, 260; 439/55, 59, 65, 68

[56] References Cited

U.S. PATENT DOCUMENTS

| | | |
|---|---|---|
| 5,063,280 | 11/1991 | Inagawa et al. .................. 219/121.7 |
| 5,073,687 | 12/1991 | Inagawa et al. .................. 219/121.7 |
| 5,150,280 | 9/1992 | Arai et al. ........................... 361/783 |
| 5,215,593 | 6/1993 | Nojo et al. ........................... 134/22.1 |
| 5,302,798 | 4/1994 | Inagawa et al. .................. 219/121.7 |
| 5,319,243 | 6/1994 | Leiche et al. ....................... 257/692 |
| 5,418,690 | 5/1995 | Conn et al. .......................... 361/794 |

*Primary Examiner*—Leo P. Picard
*Assistant Examiner*—David Foster
*Attorney, Agent, or Firm*—Fitzpatrick, Cella, Harper & Scinto

[57] ABSTRACT

In a printed circuit board on which a plurality of electronic components are mounted, a first electronic component having the largest number of input and output pins among the electronic components is arranged at or near the center of the printed circuit board. Wiring patterns including a signal line pattern, a first power supply pattern, and a first ground pattern almost radially arranged from the first electronic component, thereby mounting the electronic components at a high density with a high wiring efficiency.

16 Claims, 3 Drawing Sheets

PRINTED CIRCUIT BOARD

BACKGROUND OF THE INVENTION

1. Field of the Invention

The present invention relates to a printed circuit board on which electronic components are optimally mounted.

2. Description of the Related Art

No clear standards have been conventionally established for the method of arranging electronic components on a printed circuit board and the method of wiring signal line, power supply, and ground (to be referred to as GND hereinafter) patterns. Pattern circuits have been designed on the basis of experiences of pattern circuit designers and favorable interconnect architectures assessed from some information available from circuit diagrams.

In printed circuit boards having recent digital circuits, however, strong demand has arisen for multiple functions along with a variety of customer needs. Interconnect architectures must be designed avoiding high-density components in limited spaces of printed circuit boards. Strong demand has arisen for high-speed data processing in OA equipments, and the clock frequency continues to increase. Increases in erroneous operations and radiation noise, which are traced back to the above demands, bring about problems such as long development periods and high cost.

SUMMARY OF THE INVENTION

The present invention has been made to solve the conventional problems described above, and has as an objective to provide a printed circuit board capable of mounting electronic components at a high density with a high wiring efficiency.

It is another objective of the present invention to provide a printed circuit board with excellent transmission characteristics and radiation noise characteristics.

The above and other objectives, features, and advantages of the present invention will be apparent from the following detailed description of the preferred embodiment in conjunction with the accompanying drawings.

DESCRIPTION OF THE PREFERRED EMBODIMENT

Figure 1:
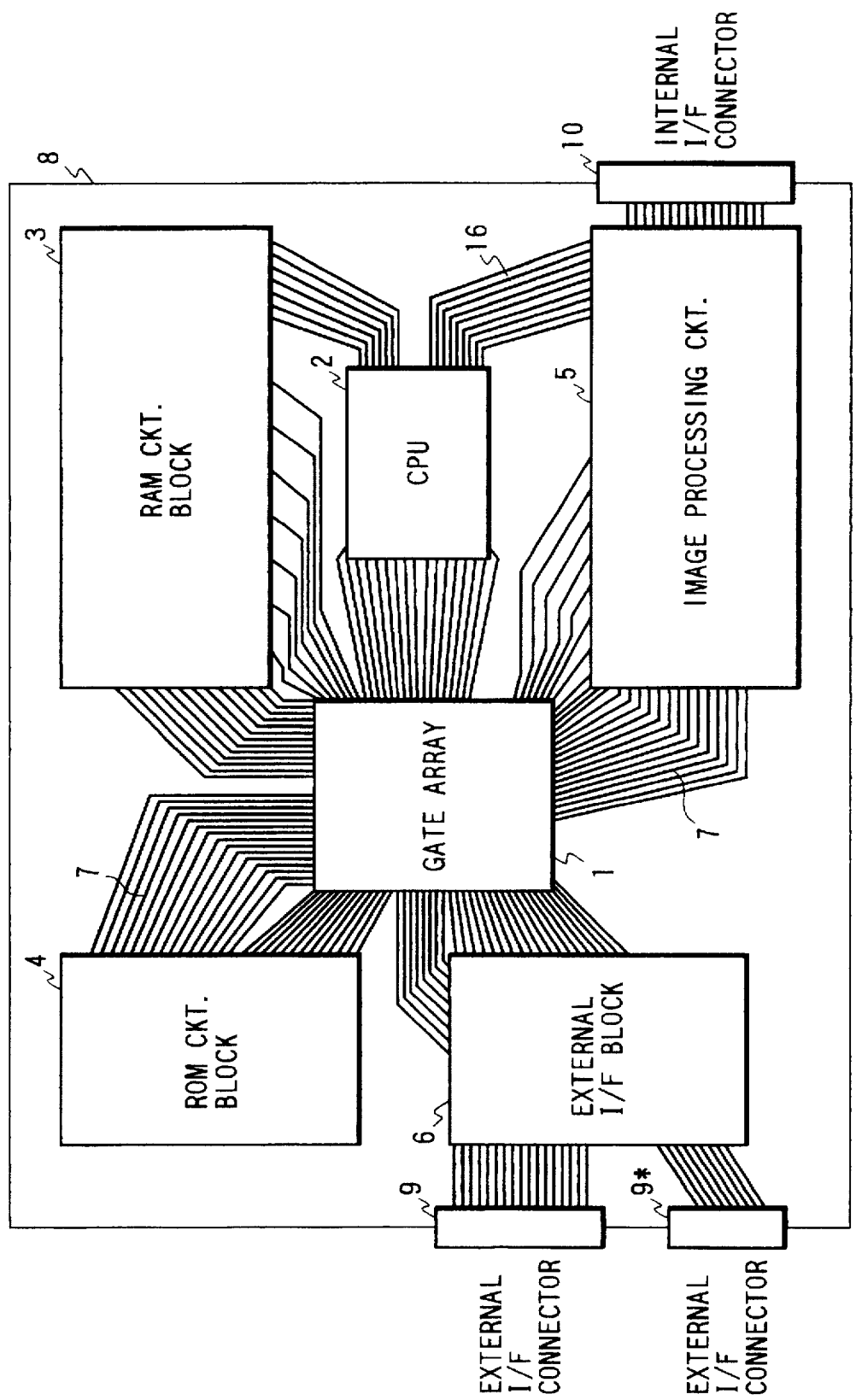
FIG. 1 is a view showing the component layout and wiring state of an entire printed circuit board according to the first embodiment of the present invention.

The preferred embodiment of the present invention will be described below with reference to the accompanying drawings. FIG. 1 is a view showing the component layout and wiring state of an entire printed circuit board according to the first embodiment of the present invention. FIG. 1 shows a state in which wiring lines radially spread from a gate array as an electronic component located around the center of the printed circuit board and having the largest number of input and output pins.

The printed circuit board shown in FIG. 1 comprises a bus control gate array 1 as an electronic component having the largest number of input and output pins, a CPU 2 for performing arithmetic operations located near the gate array 1, a RAM circuit block 3, a ROM circuit block 4, an image processing circuit 5, an external interface (to be referred to as an I/F hereinafter) block 6, radial wiring patterns 7, two external I/F connectors 9 and 9*, and an internal I/F connector 10.

The gate array 1 is arranged at the center of a printed circuit board 8 because the gate array 1 has the largest number of input/output pins and a large number of wiring lines.

In the printed circuit board 8, a plurality of circuit blocks are arranged to surround the gate array 1. More specifically, the plurality of circuit blocks, such as the CPU 2, the RAM circuit block 3, the ROM circuit block 4, the image processing circuit 5, and the I/F block 6, are arranged in the peripheral portion of the printed circuit board 8 so as to surround the gate array 1. Each of the plurality of circuit blocks are arranged to surround the gate array 1 are connected to the gate array 1 through each radial wiring pattern 7.

The radial wiring patterns 7 radially spread from the gate array 1 at the center to the CPU 1, the RAM circuit block 3, the ROM circuit block 4, the image processing circuit 5, the external I/F block 6, the external I/F connectors 9 and 9*, and the internal I/F connector 10.

The CPU 2 having a relatively large number of input/output pins among the plurality of electronic components is arranged to surround the gate array 1 together with the remaining ones of the plurality of circuit blocks. The CPU 2 is located between the RAM circuit block 3 and the image processing circuit 5 which serve as the circuit blocks to be connected to the CPU 2. The CPU 2 is connected to the RAM circuit block 3 and the image processing circuit 5 through connection patterns 16.

Figure 2:
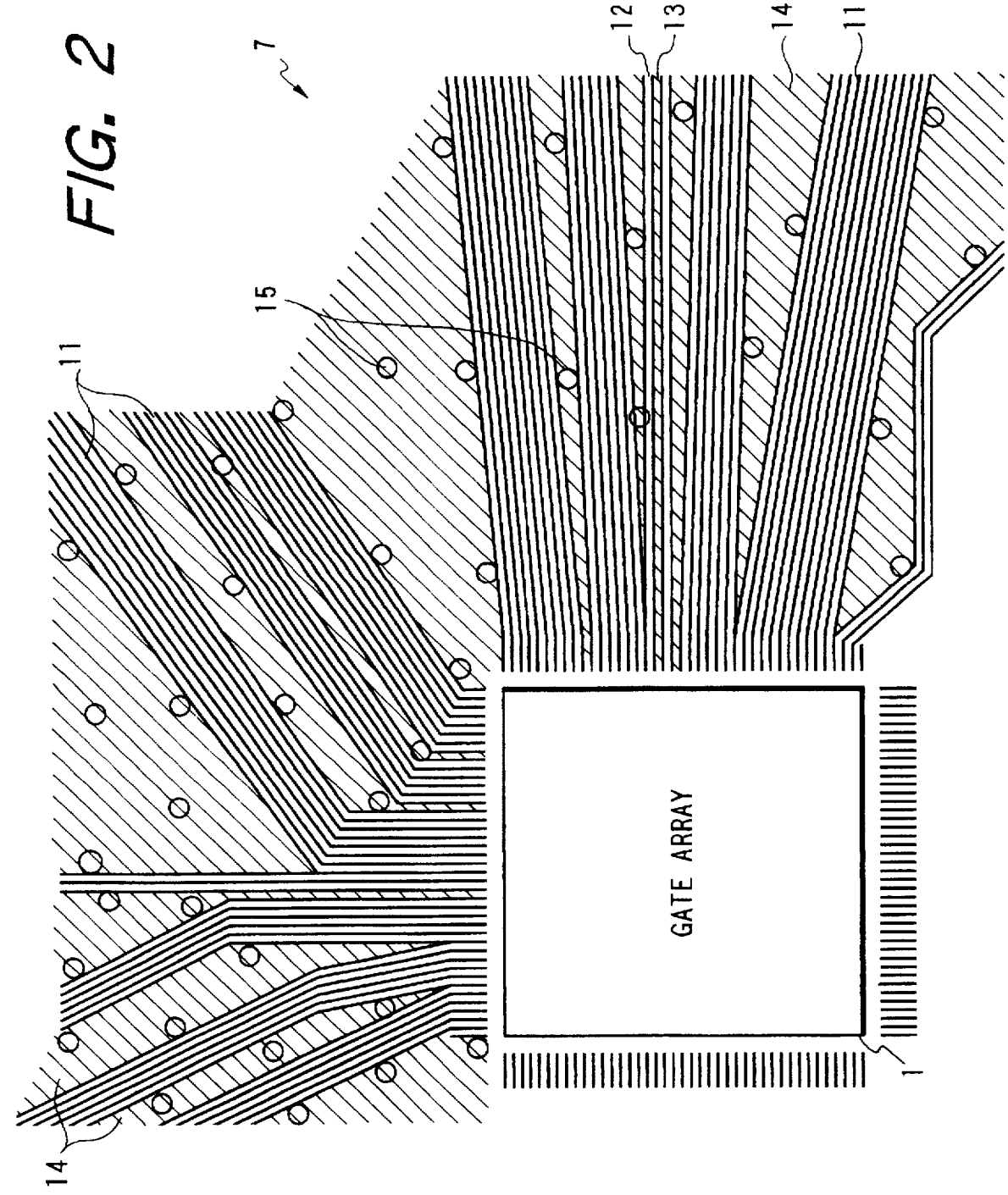
FIG. 2 is a detailed view showing the gate array portion of the printed circuit board shown in FIG. 1.

FIG. 2 is an enlarged view of the peripheral portion of the gate array in FIG. 1. The gate array, serving as an electronic component having the largest number of input and output pins, and its surrounding portion are enlarged to illustrate the radial wiring patterns in detail.

The radial wiring patterns 7 spread from the gate array 1 at the center. The radial wiring patterns 7 comprise radial signal line patterns 11, a clock line pattern 12, a power supply pattern 13, and a GND pattern 14. Through holes 15 are formed in the GND pattern 14.

The power supply pattern 13 and the GND pattern 14 are located between the signal line patterns 11 each having a plurality of signal lines. At least one power supply pattern 13 or GND pattern 14 is arranged every ten signal line patterns 11.

At least one of the power supply pattern 13 and the GND pattern 14 is located next to the clock line pattern 12.

The through holes 15 formed in the GND pattern 14 are connected to a GND pattern formed on a layer (lower surface) different from a layer (upper surface) on which the radial wiring patterns 7 are arranged. The GND patterns 14 are respectively connected to the lower GND patterns through the through holes 15. In this case, the GND pattern 14 must have a line width equal to or larger than a width at which the through hole 15 can be formed. The lower GND pattern is preferably a pattern having a given range so as to allow electrical connection between the GND patterns 14.

The through holes 15 may be arranged on the power supply pattern 13. In this case, the power supply patterns 13 are electrically connected through power supply patterns arranged on a layer (lower surface) different from a layer (upper surface) on which the radial wiring patterns 7 are formed. The power supply pattern must have a line width equal to or larger than a width at which the through hole 15 can be formed. The lower power supply pattern is preferably a pattern having a given range to allow electrical connection between the power supply patterns 13.

Figure 3:
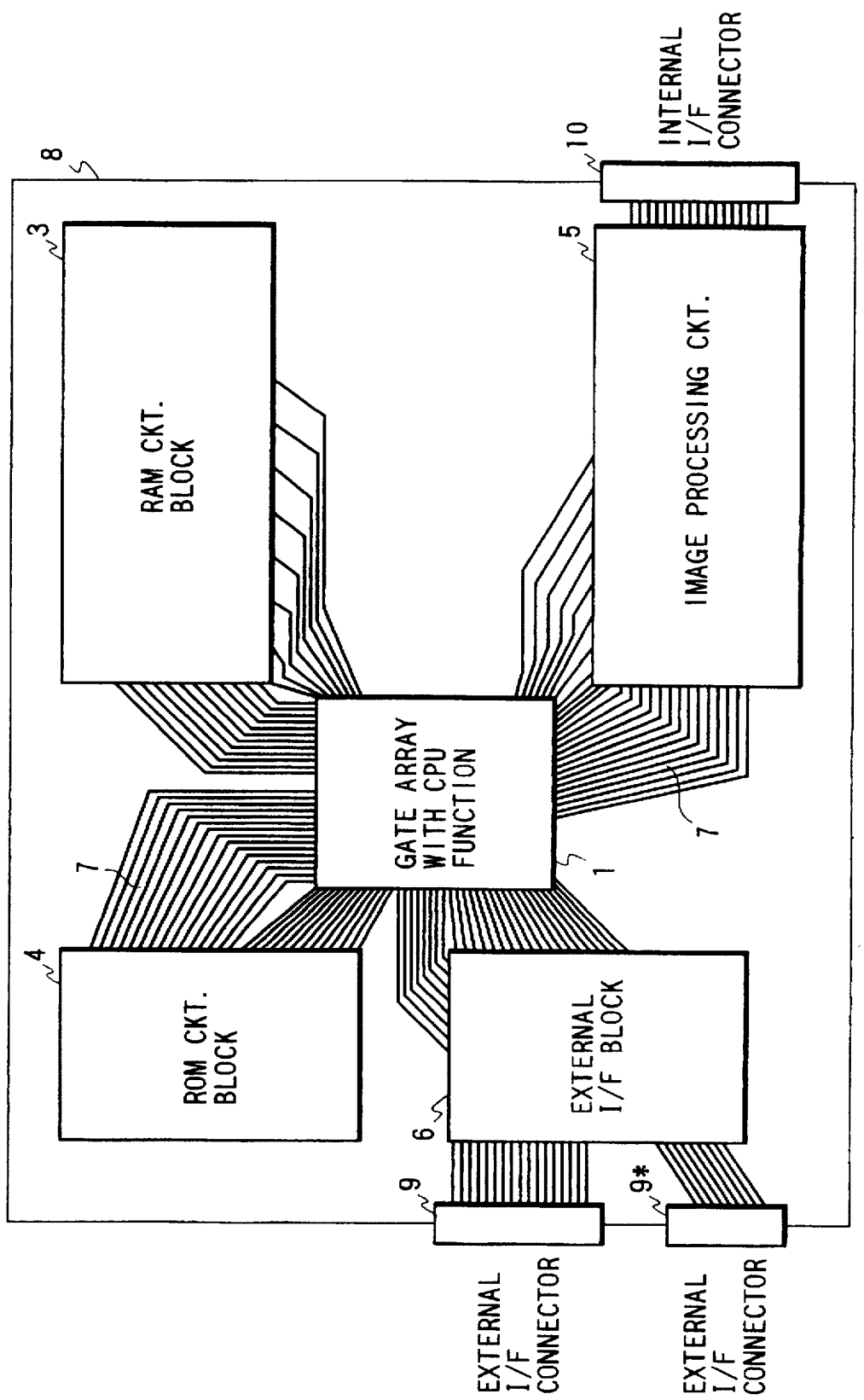
FIG. 3 is a view showing a modification of the printed circuit board shown in FIG. 1.

In the above embodiment, the gate array 1 is located at the center of the printed circuit board 1. However, the gate array 1 having a function of the CPU 2 (gate array with CPU function) may be arranged at the center of the printed circuit board 8, as shown in FIG. 3. Alternatively, the CPU 2 having a relatively larger number of input and output pins may be arranged at the center of the printed circuit board 8 in place of the gate array 1.

In the above embodiment, the radial wiring patterns 7 and the connection patterns 16 are formed on one surface of the printed circuit board 8. However, some of these patterns may be formed on the lower surface of the printed circuit board 8.

In the above embodiment, the printed circuit board 8 is assumed to be a two-sided board. However, if the printed circuit board 8 is a multi-level board, the GND and power supply patterns formed on the lower surface of the printed circuit board 8 may be formed as independent GND and power supply layers.

In the above embodiment, the gate array is arranged at the center of the printed circuit board. However, the gate array need not be arranged at the center of the printed circuit board. The gate array may be arranged near the center of the area surrounded by a plurality of circuit blocks.

As has been described above, according to the present invention, the first electronic component having the largest number of input and output pins among a plurality of electronic components is located almost at the center of an area surrounded by the plurality of circuit blocks, and the first electronic component is connected to the plurality of circuit blocks through radial wiring patterns. For this reason, electronic components can be arranged at a high density. Since radial wiring is used in place of wiring along the X and Y directions, the lengths of the wiring patterns between the components can be shortened. Even if the number of signals increases, the wiring lengths can be shortened, thereby improving the wiring efficiency. In addition, an electronic component which consumes a large current to become a noise source can be arranged at the center of an area surrounded by the plurality of circuit blocks. An increase in radiation noise caused by the unbalance of currents can be prevented.

At least one stable power supply or GND pattern is arranged adjacent to every ten signal lines, particularly, to every single clock signal line operating at a high speed. Therefore, signal operation instability, increased radiation noise, and the like, caused by an increase in frequency of the clock signal, can be prevented.

What is claimed is:

1. A printed circuit board on which a plurality of electronic components are mounted, comprising:
   a first electronic component having the largest number of input and output pins among said plurality of electronic components, said first electronic component being arranged at a predetermined position on said printed circuit board;
   a plurality of circuit blocks each having at least one of said plurality of electronic components, said plurality of circuit blocks being arranged to surround said first electronic component; and
   radial wiring patterns for respectively connecting said first electronic component and said plurality of circuit blocks arranged to surround said first electronic component.

2. A board according to claim 1, wherein said radial wiring patterns have a signal line pattern and a ground pattern.

3. A board according to claim 2, wherein said radial wiring patterns have one ground pattern arranged adjacent to a predetermined number of signal line patterns.

4. A board according to claim 2, wherein said radial wiring patterns further have a power supply pattern.

5. A board according to claim 4, wherein said radial wiring patterns have said power supply or ground pattern adjacent to at least one side of a signal line pattern such as a clock signal line pattern operating at a high speed.

6. A board according to claim 2, wherein said ground pattern is connected to a ground pattern on another layer through a through hole.

7. A board according to claim 6, wherein said ground pattern has a line width not less than a width at which a through hole having a minimum diameter can be formed.

8. A board according to claim 4, wherein said power supply pattern is connected to a power supply pattern on another layer through a through hole.

9. A board according to claim 8, wherein said power supply pattern has a line width not less than a width at which a through hole having a minimum diameter can be formed.

10. A board according to claim 1, wherein the predetermined position of said first electronic component is substantially the center of said printed circuit board.

11. A board according to claim 1, wherein said first electronic component is a gate array.

12. A board according to claim 1, wherein said first electronic component is a CPU.

13. A printed circuit board on which a plurality of electronic components are mounted, comprising:
   a first electronic component having the largest number of input and output pins among said plurality of electronic components, said first electronic component being arranged at a predetermined position on said printed circuit board;
   a plurality of circuit blocks each having at least one of said plurality of electronic components, said plurality of circuit blocks being arranged to surround said first electronic component;
   radial wiring patterns for respectively connecting said first electronic component and said plurality of circuit blocks arranged to surround said first electronic component;
   a second electronic component having a relatively larger number of input and output pins among remaining ones of said plurality of electronic components, said second electronic component being arranged to form a ring together with said plurality of circuit blocks and being arranged adjacent to any one of said plurality of circuit blocks connected to said second electronic component; and
   a connection pattern for connecting said second electronic component and any one of said plurality of circuit blocks which is adjacent to said second electronic component.

14. A board according to claim 13, wherein said plurality of circuit blocks are not arranged linearly when viewed from said first electronic component.

15. A printed circuit board on which a plurality of electronic components are mounted, comprising:
   a plurality of circuit blocks each having at least one of said plurality of electronic components, said plurality of circuit blocks being arranged on said printed circuit board so as to form a ring;

a first electronic component having a relatively larger number of input and output pins among said plurality of electronic components, said first electronic component being arranged substantially at the center of the ring formed by said plurality of circuit blocks; and radial wiring patterns for respectively connecting said first electronic component and said plurality of circuit blocks arranged to surround said first electronic component.

16. A printed circuit board on which a plurality of electronic components are mounted, comprising:

a plurality of circuit blocks each having at least one of said plurality of electronic components, said plurality of circuit blocks being arranged on said printed circuit board so as to form a ring;

a first electronic component having a relatively larger number of input and output pins among said plurality of electronic components, said first electronic component being arranged substantially at the center of the ring formed by said plurality of circuit blocks;

radial wiring patterns for respectively connecting said first electronic component and said plurality of circuit blocks arranged to surround said first electronic component, said radial wiring patterns having a signal line pattern and a ground pattern in such a manner that one ground pattern is arranged adjacent to a predetermined number of signal line patterns;

another ground pattern formed on another layer different from a layer of said printed circuit board on which said plurality of circuit blocks are arranged to surround said first electronic components; and a through hole for connecting said ground pattern and said other ground pattern.

* * * * *

UNITED STATES PATENT AND TRADEMARK OFFICE
CERTIFICATE OF CORRECTION

PATENT NO. : 5,790,383

DATED : August 4, 1998

INVENTOR(S) : Inagawa

It is certified that error appears in the above-identified patent and that said Letters Patent is hereby corrected as shown below:

COLUMN 2:

Line 17, "are" should read (second occurrence) --and are --.

COLUMN 6:

Line 14, "components;" should read --component;--.

Signed and Sealed this

Fourth Day of May, 1999

Attest:

Attesting Officer

Q. TODD DICKINSON

Acting Commissioner of Patents and Trademarks